United States Patent
Baumann

(10) Patent No.: US 9,831,033 B2
(45) Date of Patent: Nov. 28, 2017

(54) METHOD FOR PRODUCING MAGNETIC CORES

(71) Applicant: SUMIDA COMPONENTS & MODULES GMBH, Obernzell (DE)

(72) Inventor: Michael Alfons Baumann, Passau (DE)

(73) Assignee: Sumida Components and Modules GMBH, Obernzell (DE)

( * ) Notice: Subject to any disclaimer, the term of this patent is extended or adjusted under 35 U.S.C. 154(b) by 0 days.

(21) Appl. No.: 14/648,908

(22) PCT Filed: Dec. 4, 2013

(86) PCT No.: PCT/EP2013/075579
§ 371 (c)(1),
(2) Date: Jun. 1, 2015

(87) PCT Pub. No.: WO2014/086886
PCT Pub. Date: Jun. 12, 2014

(65) Prior Publication Data
US 2015/0318096 A1    Nov. 5, 2015

(30) Foreign Application Priority Data
Dec. 4, 2012 (DE) .......... 10 2012 222 224

(51) Int. Cl.
*H01F 3/10* (2006.01)
*H01F 41/02* (2006.01)
(Continued)

(52) U.S. Cl.
CPC ..... *H01F 41/0246* (2013.01); *C23C 18/1837* (2013.01); *C23C 18/1841* (2013.01);
(Continued)

(58) Field of Classification Search
CPC ........ H01F 41/0246; H01F 41/16; H01F 3/08; H01F 3/10; H01F 1/0036; H01F 1/344;
(Continued)

(56) References Cited

U.S. PATENT DOCUMENTS 2,985,939 A    5/1961   Brockman
5,138,546 A *  8/1992   Johnson ............... H01F 1/344
                                              252/62.54
(Continued)

FOREIGN PATENT DOCUMENTS

DE    K22888      10/1956
DE    973 822     6/1960
(Continued)

OTHER PUBLICATIONS

English Translation of Notice dated May 31, 2016 in corresponding JP Application No. 2015-546000.
(Continued)

*Primary Examiner* — A. Dexter Tugbang
(74) *Attorney, Agent, or Firm* — Paul A. Fattibene; Fattibene and Fattibene LLC

(57) ABSTRACT

A method for fabricating magnetic cores, wherein the magnetic cores have at least two materials with different magnetic properties. The materials are selected from a ferrite material, an oxide ceramic material and a superparamagnetic material and are formed alternately in individual regions along the magnetic core.

22 Claims, 7 Drawing Sheets

(51) Int. Cl.
    *C23C 18/18*    (2006.01)
    *H01F 3/08*     (2006.01)
    *H05K 3/30*     (2006.01)
    *H01F 27/26*    (2006.01)
    *H01F 1/00*     (2006.01)
    *H01F 1/34*     (2006.01)
    *H01F 41/16*    (2006.01)

(52) U.S. Cl.
    CPC ............... *H01F 3/08* (2013.01); *H01F 3/10* (2013.01); *H01F 27/263* (2013.01); *H05K 3/303* (2013.01); *H01F 1/0036* (2013.01); *H01F 1/344* (2013.01); *H01F 41/16* (2013.01); *H01F 2003/106* (2013.01); *Y10T 29/49021* (2015.01); *Y10T 29/49075* (2015.01)

(58) Field of Classification Search
    CPC ............ H01F 27/263; H01F 2003/106; C23C 18/1837; C23C 18/1841; H05K 3/303; Y10T 29/49021; Y10T 29/49075
    See application file for complete search history.

(56) References Cited

U.S. PATENT DOCUMENTS

| | | | |
|---|---|---|---|
| 5,935,722 A | 8/1999 | Moorhead et al. | 428/694 |
| 6,931,713 B2 | 8/2005 | Roshen | 29/609 |
| 2002/0132136 A1 | 9/2002 | Roshen | 428/692 |
| 2004/0082179 A1* | 4/2004 | Saito | C23C 18/1841 438/696 |
| 2007/0102805 A1* | 5/2007 | Kim | H05K 3/303 257/698 |
| 2008/0012679 A1 | 1/2008 | Okabe et al. | 336/200 |
| 2012/0229238 A1 | 9/2012 | Hirota et al. | 355/297 |

FOREIGN PATENT DOCUMENTS

| | | |
|---|---|---|
| DE | 23 55 051 | 5/1975 |
| EP | 1 564 764 | 8/2005 |
| EP | 1 501 106 | 2/2011 |
| EP | 2500916 | 9/2012 |
| GB | 760799 | 11/1956 |
| JP | 09219333 A * | 8/1997 |
| JP | 2006-156433 | 6/2006 |
| JP | 2008-053579 | 3/2008 |
| JP | 2009-259971 | 11/2009 |
| JP | 2011-119661 | 6/2011 |
| JP | 2013-153025 | 8/2013 |

OTHER PUBLICATIONS

German report dated May 6, 2015 in corresponding German Application No. 10 2012 222 224.3, including English translation of JP 2008-053549.

German report dated Feb. 26, 2015 in corresponding German Application No. 10 2012 222 224.3.

German report dated Oct. 28, 2013 in corresponding German Application No. 10 2012 222 224.3.

* cited by examiner

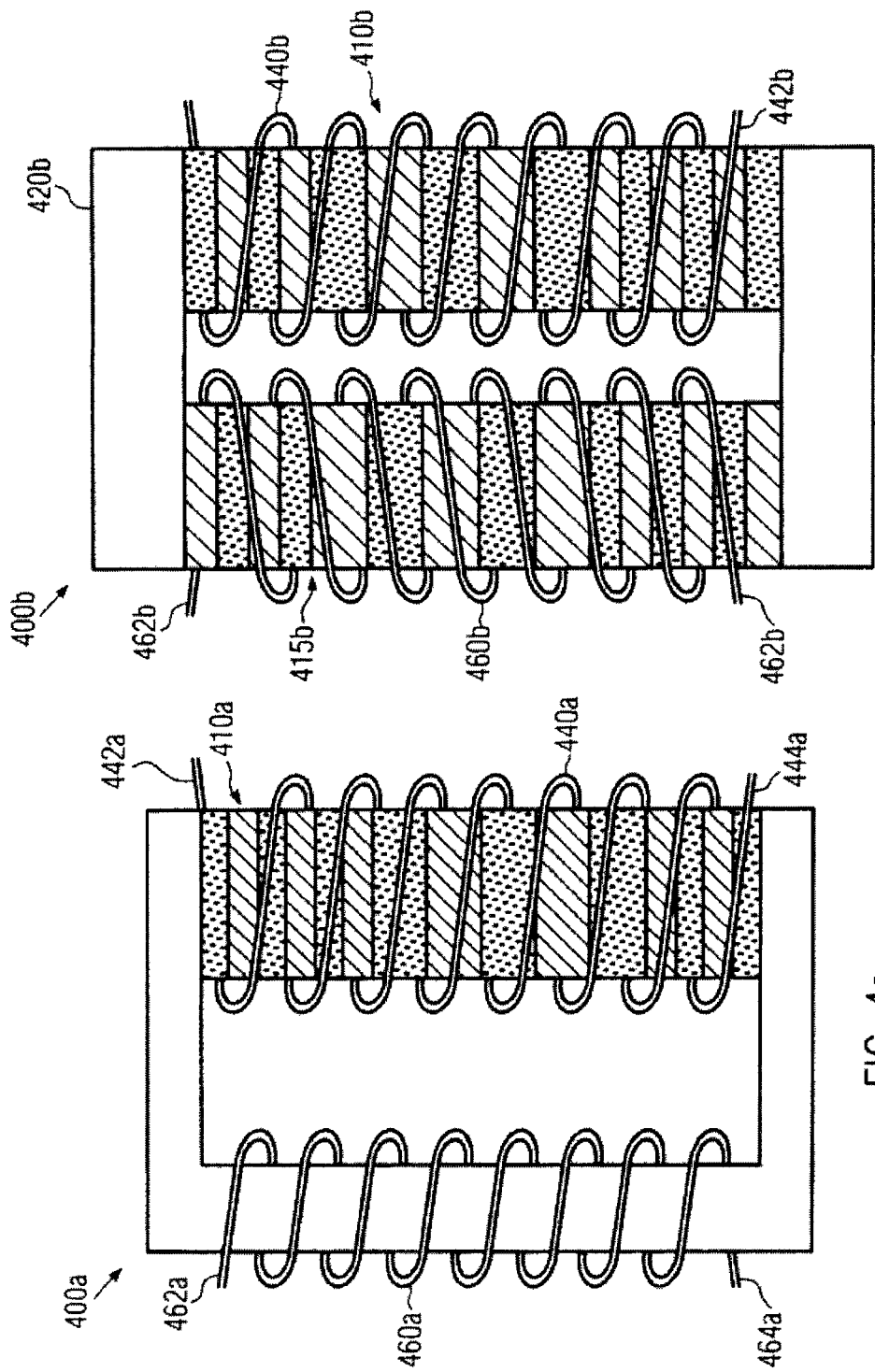

METHOD FOR PRODUCING MAGNETIC CORES

FIELD OF THE INVENTION

The present invention relates to magnetic cores, in particular magnetically soft cores, comprising two or more ferrite materials with different magnetic properties, and a method for fabricating the same.

BACKGROUND OF THE INVENTION

The constant further development in the field of electronics results in increasingly efficient electronic circuits that are employed in a plurality of regions and hence require a corresponding supply with appropriate voltages and currents. In the development of new efficient circuits, attention is also paid to an increasing miniaturization of electronic components, thus permitting an increasingly broad application of electronic control and power circuits in many fields. With proceeding miniaturization, however, a compact and efficient voltage supply is required, which is provided, for example, in the form of clocked circuits. With clocked power supplies, a high flexibility in the adaptation of output voltages required for operating electronic circuits relating to the available input voltages is important. In mobile applications, for example, the available supply voltages are present in the form of common battery or accumulator voltages which are not necessarily suited for the operation of electronic circuits and must be adapted accordingly. Typically, output voltages of batteries or accumulators vary over their typical service lives and decrease with increasing age. Thus, adapting the provided voltages and reducing voltage fluctuations are also of great importance in the development of new efficient electronic circuits.

A further important issue in the development of efficient electronic circuits is a reliable and stable operation, and a power consumption over a large power range, preferably without major losses. Therefore, in any development phase, it is also an object to further reduce the power loss of electronic circuits, components and/or parts.

Inductive components, for example storage inductors, interference inductors, transformers etc., represent important components of electronic circuits. The latter largely also govern the costs of electronic circuits and components since in the production of magnetic cores, typically expensive materials and complicated production processes are required to ensure desired magnetic properties or a desired magnetic behavior and provide a sufficient controllability of magnetic cores over the complete power range. Furthermore, a volume corresponding to the size of the inductive component is required on pertaining printed circuit boards and in respective housings, so that a realization of entire compact setups is getting ever more complicated with increasing miniaturization. Here, of course, high efficiency is also important, i.e. a preferably low generation of power loss. This requires, for example, an inductive component with a good magnetic coupling of individual windings with respect to each other, a reduction of leakage fluxes, a good magnetic shielding to the outside and an improved thermal behavior since the thermal loss of sides of the inductive component represents an essential proportion in power loss and may require further cooling. Further requirements to be taken into account are, for example, given by, depending on the applied voltages, a necessary insulation strength and an accordingly good mechanical stability and resistance to most diverse environmental influences. This is in particular true for a plurality of applications, for example in mobile applications, such as in the field of portable units, applications in the automotive industry, and the like.

A reduction of thermal losses may be achieved, among other things, by avoiding eddy currents in magnetic cores and/or windings. From document US 2002/0132136 A1, an alternating arrangement of magnetic plates and insulating films is known, for example.

Document EP 1 501 106 B1 shows a ferrite core which is produced by gluing segments of pressed ferrite tablets to each other. The segments are each separated by a magnetic insulator. The term "magnetic insulator" describes a material with a relative permeability of approx. one (relative permeability of vacuum). These magnetic insulators act as distributed air gaps.

By dividing one large air gap into several small air gaps, the magnetic lines of force are better guided in the core. While the insulating films or magnetic insulators may thereby counteract the formation of eddy currents in the arrangement, leakage fluxes are only partly suppressed and a low-loss guidance of a magnetic flux is only partially achieved. Furthermore, these known arrangements lead to "bulges" of the magnetic field at the films or insulators which are provided in a winding provided over the arrangement or in lines provided near the magnetic arrangement, induce voltage and thus may cause current flow.

Accordingly designed well-known cores have a number of further disadvantages. For example, by the insulating portions (by means of insulating films or insulators) which interrupt the magnet portions in the core, heat conduction, and thus a dissipation of heat from the core, is only insufficiently achieved within the core. The thermal resistance of the insulating portions is often too high to ensure a desired heat flow towards portions that dissipate the heat to the environment or a connected heat reservoir and thus a corresponding dissipation of heat.

Starting from the well-known arrangements, it is an object of the present invention to provide a magnetic core having a good thermal behavior. It is in particular an object to provide a magnetic core having an improved conduction of heat along the magnetic core.

SUMMARY OF THE INVENTION

The above mentioned object is achieved, according to one aspect, by a magnetic core comprising at least two connected materials of different magnetic permeability, each of which forming a region such that the formed regions are arranged alternately along a longitudinal direction of the magnetic core, and, according to other aspects, by methods for fabricating such cores.

A method for fabricating the core may comprise, according to one embodiment, providing at least two materials having different magnetic properties, for example at least two ferrite materials or a combination of at least one ferrite material and at least one oxide ceramic and the like, and filling a mold corresponding to the magnetic core for forming a material volume in the mold such that the material volume comprises alternately regions of each one of the at least two materials. Furthermore, during the method, the at least two materials may be exposed to pressure in the mold in the course of the method.

It should be noted at this point that the term "ferrite material" as used in the present disclosure refers to both, a preliminary ferrite material, for example a metal oxide or generally a metal oxide mixture which was not yet subjected to any sintering process (metal oxide or metal oxide mixture before a sintering process; in this sense a preliminary stage of a ferrite material), and a preliminary ferrite material that has been subjected to a sintering or calcination process (metal oxide or metal oxide mixture after the sintering process or calcination process) which thus forms a ferrite material to be formed of the corresponding preliminary ferrite material, although no explicit distinction will be made linguistically. A distinction between a ferrite material and its corresponding preliminary ferrite material may be made in the actual production phase, as indicated above.

According to an embodiment of the first aspect, a method for fabricating a magnetic core comprises providing at least two materials having different magnetic properties. Herein, a first one of the at least two materials comprises a first ferrite material, and a second one of the at least two materials comprises a second ferrite material and/or an oxide ceramic material. A mold corresponding to the magnetic core is filled for forming a material volume in the mold. The material volume comprises alternately regions of each of the at least two provided materials. The at least two provided materials filled into the mold are subsequently exposed to pressure. Thereby, for example gapped ferrite cores may be produced at low costs. Since the mold is filled with material, this method may be employed without many efforts and complications in a large-scale production where magnetic cores may be produced with predetermined and reproducible magnetic properties. Furthermore, according to special embodiments, a magnetic core may be provided thereby which permits an advantageous dissipation of heat, so that a complicated cooling of the core may be mostly eliminated. By this, more compact electronic components are possible with such cores. Moreover, integrally formed ferrite cores of solid ceramics are also possible which thereby do no longer require any organic adhesives or plastics and thereby provide a longer service life than well-known cores.

According to a further advantageous embodiment, the method may comprise, following the exposure to pressure, additionally exposing the material volume to heat. Exposing the material volume pressed by the action of pressure to heat results in a sintering of the material volume, so that the connection between individual regions shows higher stability. In this manner, ferrite cores with a "sintered-in gapping" may be produced at low costs.

According to further advantageous embodiments, the method may furthermore comprise selecting the at least two materials, such that the at least two selected materials have different Curie temperatures and/or different thermal conductivities and/or different thermal diffusivities and/or different electric conductivities and/or different magnetic properties, such as different permeabilities or different saturation flux densities. Thereby, magnetic cores may be fabricated which comprise properties that are exactly defined for their use. Thus, according to exemplary embodiments, by the selection of materials with different magnetic permeabilities and/or Curie temperatures and/or saturation flux densities, an adjustment of a desired change in the magnetic properties, for example magnetic permeability, etc., may be effected along the magnetic core, which, in case of different Curie temperatures, may be particularly temperature-dependent.

According to a further advantageous embodiment, the method may furthermore comprise adjusting the magnetic and/or mechanical and/or thermal and/or electric properties of the first material and/or of the second material, before exposing them to a pressure, by adding an additive. The additive may comprise at least one of the group consisting of titanium (Ti), aluminum (Al), chromium (Cr), magnesium (Mg), copper (Cu), nickel (Ni), tin (Sn), germanium (Ge), strontium (Sr), zinc (Zn), manganese (Mn), potassium (K), niobium (Nb), zirconium (Zr), calcium (Ca), silicon (Si), vanadium (V), cobalt (Co), hafnium (Hf), tungsten (W), bismuth (Bi), an oxide of these elements and/or a carbonate and/or any other chemical compound comprising one of these elements. Thereby, an advantageous adjustment of magnetic and/or mechanical and/or thermal and/or electric properties with respect to the core to be fabricated may be effected, so that the latter has an improved mechanical and/or magnetic and/or thermal and/or electric stability.

According to a further advantageous embodiment, the method may furthermore comprise presintering (=calcination) the at least two materials before filling the mold, where the at least two materials are each provided as powder, granules, plates, scales, chunks or rolled sheet. By presintering the powder within a range of 700° C. to 1200° C., the occurrence of tensions during the actual sintering process may be avoided or tensions during sintering reduced, respectively.

According to a further advantageous embodiment, the material volume in the mold is reduced by pressure to less than 90% or less than 50% of the material volume, or to at most 10% of the material volume. Thereby, an appropriate strength of the magnetic core may be adjusted.

According to a further advantageous embodiment, the exposure to pressure may be accomplished by means of a CNC-controlled hydraulic press. Thereby, a pressure applied to the ferrite material located in the mold and, optionally, to the oxide ceramic material that is exactly adapted to the material composition in the mold, may be adjusted and exerted. This ensures that pressed parts resulting from the method have an improved capacity to withstand stresses, an improved strength, and a constant and homogenous density.

According to a second aspect of the invention, a method for producing a magnetic core is provided, the method comprising providing at least one first material and one second material having different magnetic properties, wherein said first material comprises a first ferrite material and said second material comprises a second ferrite material and/or an oxide ceramic material, forming at least one first material volume portion by pressing at least a part of the provided first material, and forming at least one second material volume portion by pressing at least a part of the provided second material, applying a liquid for forming a liquid film at least on one exposed surface of the first material volume portion and/or the second material volume portion, and arranging a material volume portion directly on the liquid film of another material volume portion. According to this aspect, the connection of the different ferrite materials, and optional oxide ceramic materials, may be effected, instead of by a common pressing, by a separate pressing of the different ferrite and optional oxide ceramic materials into one core each. According to this aspect, with the material volume parts, different core pellets or core tablets may be provided which permit, according to a modular system, a simple and very flexible production of different cores.

According to an advantageous embodiment, a sintering process may be subsequently performed by exposing the connected material volume portions to heat after the material volume portions have been arranged one upon the other. After the sintering process, an inseparable form-fit connection of at least two material volume portions is formed.

By this "film-method", the sandwich pressing method of the first aspect may be avoided where the mold is filled with layers of powder of different materials and the powder is subsequently pressed in the mold and individual portions of different material are no longer sufficiently separated from each other.

According to a further advantageous embodiment, the aqueous or alcoholic solution comprises a polyethylene glycol solution, a polyvinyl alcohol solution, or an acrylate solution. However, other liquids are also conceivable. Thereby, an efficient etching of ferrite material or oxide ceramic material by means of the film may be achieved.

According to a further advantageous embodiment, the arrangement of the at least one second material volume portion comprises rotating the at least one second material volume portion during the arrangement operation. Thereby, an etching of ferrite material or oxide ceramic material at the surface from at least one material volume portion during arranging the material volume portion may be improved.

According to a third aspect of the invention, a magnetic core is provided which comprises at least two connected regions alternately arranged along a longitudinal direction of the magnetic core and comprising at least a first material and a second material, which differ from each other and comprise different magnetic permeabilities, wherein each region comprises a material of the at least two materials. The first material comprises a first ferrite material, and the second material comprises a second ferrite material and/or an oxide ceramic material, or the second material comprises a superparamagnetic material. Thereby, inexpensive magnetic cores may be provided which, compared to conventional cores, show a reduced leakage flux due to an improved guidance of a magnetic flux through the core.

According to an advantageous embodiment, the at least two regions are connected to each other by sintering, i. e. the at least two connected materials are sintered to each other. Correspondingly designed cores have a great stability.

According to a further advantageous embodiment, at least one region is designed as a layer extending over the entire cross-sectional area of the magnetic core. Thereby, clearly separated regions of the magnetic core are defined, such that the magnetic core has an altogether improved saturation behavior due to the provided "air gap".

According to a further advantageous embodiment, the second material has a relative permeability of lower than 10, and the first material has a relative permeability of higher than 10. Thereby, air gaps may be reliably provided and a suited saturation behavior of the core may be suitably adjusted. In particular, a suitably high saturation degree may be achieved. According to specific advantageous embodiments, a relative permeability of the second material may be lower than 3.

According to a further advantageous embodiment, the thermal coefficients of linear expansion of the at least two materials differ from each other by less than 10%, or by less than 5%, or by less than 1%, or by less than 0.5%. This ensures that corresponding magnetic cores have stable mechanical properties during operation.

According to a further advantageous embodiment, the second material may have a superparamagnetic behavior. Thereby, gaps with very small losses are realized since materials with a superparamagnetic behavior have a very low hysteresis, a so-called zero hysteresis.

According to a further advantageous embodiment, the second material may be a compound material of nanoscale particles whose maximal dimensions are within a range of 5 nm to 50 nm. In these advantageous embodiments, gaps with very low losses are realized in a simple and very effective manner.

According to a further advantageous embodiment, the second material may comprise nanoscale particles of ferrite material or metal material. In this advantageous embodiment, gaps with low losses are given in a simple and reliable manner.

According to a further advantageous embodiment, the second material may have a relative permeability $\mu_r$ with $1<\mu_r<3$, or $1<\mu_r<2$, or $1<\mu_r<1.6$, or $1<\mu_r<1.3$. Thereby, "permeable" air gaps are provided which guide lines of force advantageously.

According to a further advantageous embodiment, the second material comprises the second ferrite material, and the first and/or the second ferrite material has a substance amount fraction of ZnO within a range of 0 mole % to 60 mol %, and/or of $Fe_2O_3$ within a range of 20 mol % to 80 mol %. The rest to 100% essentially consists of MnO or NiO. It should be pointed out that the percental mole ratio of the metal ions may also be achieved by using other chemical compounds which carry the mentioned metal ions. Thereby, extremely lossless regions may be provided by a predetermined ferrite material with a defined mixture, where mechanical and/or electric and/or thermal and/or magnetic properties are defined.

According to a further advantageous embodiment, the first and the second ferrite materials have different substance amount fractions of zinc Zn (e. g. as ZnO) and/or copper Cu (e. g. as CuO). Thereby, more advantageous mechanical and/or electric and/or magnetic properties of individual regions may be adjusted.

According to a further advantageous embodiment, at least the first ferrite material may comprise an additive which is at least one of the group consisting of titanium (Ti), aluminum (Al), chromium (Cr), magnesium (Mg), copper (Cu), nickel (Ni), tin (Sn), germanium (Ge), strontium (Sr), potassium (K), niobium (Nb), zirconium (Zr), calcium (Ca), silicon (Si), vanadium (V), cobalt (Co), hafnium (Hf), tungsten (W), bismuth (Bi), an oxide of these elements and/or a carbonate and/or any other chemical compound comprising one of these elements. Accordingly, more advantageous adjustments of mechanical properties of the ferrite materials are possible.

According to a further advantageous embodiment, the second material may comprise the second ferrite material. Furthermore, the first ferrite material and the second ferrite material may have different saturation flux densities and/or Curie temperatures. Thereby, "air gaps" may be provided in a simple manner so as provide, for example, a desired saturation behavior.

According to a further more advantageous embodiment, the second ferrite material may have a Curie temperature within a range of <0° C., or from 0° C. to 100° C., or from 0° C. to 50° C., or from 15° C. to 35° C., and the first ferrite material may have a Curie temperature within a range of 100° C. to 700° C., or 100° C. to 500° C., or 200° C. to 350° C. Thereby, an advantageous magnetic behavior, in particular a thermal inductance behavior, and/or a more advantageous thermal behavior of the magnetic permeability of the core may be adjusted. Furthermore, a more advantageous change of the magnetic permeability along the length of the magnetic core may be defined.

According to a further more advantageous embodiment, the first and the second ferrite materials may comprise different Curie temperatures and/or different thermal conductivities and/or different thermal diffusivities and/or different electric conductivities. Thereby, a magnetic core with advantageous magnetic properties and/or thermal properties and/or electric properties may be provided, so that leakage fluxes and/or induced voltages and/or heat flows may be advantageously suppressed or removed, and thus power loss transferred in the inductive component is reduced.

According to a further more advantageous embodiment, at least one region of ferrite material may be equipped with a very low permeability independent of its Curie temperature. Thereby, leakage fluxes and/or bulges of a magnetic field guided through the core may be advantageously further reduced, and a lossless guidance of the magnetic flux through the magnetic core may be ensured.

According to a further more advantageous embodiment, regions with the second ferrite material may become smaller from a center of the magnetic core in the longitudinal direction of the core towards an edge of the magnetic core. In this manner, leakage fluxes and bulges of the magnetic field may be more advantageously suppressed.

According to a further advantageous embodiment, at least one region with the second ferrite material may be at most as large as the smallest region with the first ferrite material. This ensures that the magnetic core has more advantageous magnetic properties.

According to a further advantageous embodiment, a proportion of a partial volume of a region comprising a ferrite material, in which the mass fraction of the ferrite material decreases from more than 90 mass percent, or more than 95 mass percent to less than 30 mass percent, or less than 10 mass percent, or less than 5 mass percent, or less than 1 mass percent, to a total volume of the region is less than 30% or less than 10% or less than 5% or less than 1%. Thereby, clearly separated regions along the magnetic core are defined, so that magnetic cores with exactly predefined magnetic properties and/or mechanical properties and/or thermal properties and/or electric properties are provided.

According to a further advantageous embodiment, a multi-part core arrangement is provided which comprises at least one magnetic core according to one of the previously illustrated embodiments and at least one winding which is provided over the at least one magnetic core.

At least according to one of the above represented aspects and embodiments, magnetic cores are provided in which winding losses are clearly reduced by guiding the magnetic flux through the core.

At least according to some of the above represented aspects and embodiments, magnetic cores are provided in which magnetic leakage fluxes are suppressed.

At least according to some of the above represented aspects and embodiments, magnetic cores are provided in which an occurrence of eddy currents is suppressed.

At least according to some of the above represented aspects and embodiments, magnetic cores are provided in which the guidance of lines of force in the core is optimized, so that bulges of the lines of force are preferably suppressed.

The present invention also provides magnetic cores with predetermined magnetic properties and/or thermal properties and/or mechanical properties and/or electric properties and methods for producing the same, where the production costs are lower, with a simultaneously reduced power loss and a stable operation with an improved service life.

The present invention provides the advantage of a cost-optimized production of cores according to the above represented embodiments.

Within the scope of the present disclosure, "bulges" in air gap regions of magnetic cores may be reduced by providing materials with a magnetic permeability >1.

DESCRIPTION OF THE FIGURES

Further features, advantageous embodiments and advantages of the present invention may be taken from the appended patent claims and the following detailed descriptions of illustrative embodiments, reference being made to the following figures.

FIG. 4A schematically shows a multi-part core arrangement according to an embodiment.

FIG. 4B schematically shows a view of a multi-part core arrangement according to a further embodiment.

DETAILED DESCRIPTION OF EXEMPLARY EMBODIMENTS

Figure 1:
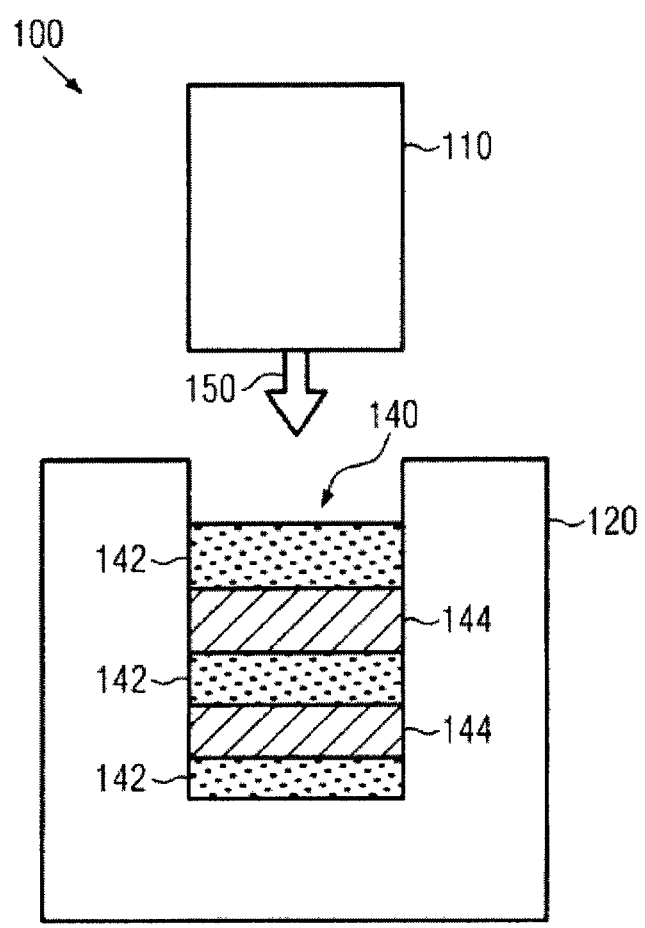
FIG. 1 schematically shows an arrangement for producing a magnetic core according to an embodiment of the invention.

FIG. 1 schematically shows a cross-sectional view of a system 100 for fabricating a magnetic core according to an embodiment. The system 100 comprises a press 110 schematically shown in FIG. 1. The system 100 further comprises a mold 120 corresponding to a magnetic core to be fabricated. As shown in FIG. 1, the mold 120 may be a negative of a bar-type core or I-core, but is not limited to it. According to alternative embodiments, (not illustrated) molds capable of fabricating U- or E-cores are conceivable. Furthermore, all other molds for forming cores that are well-known to the person skilled in the art are included in the scope of the invention.

To produce a magnetic core according to an embodiment, a ferrite material and an oxide ceramic material having different magnetic properties are provided. Oxide ceramic materials may comprise, for example, ceramic materials which may comprise ceramics on the basis of aluminum oxide and/or zirconium oxide and/or aluminum titanate and/or iron oxide. According to advantageous embodiments, the sintering temperature of the oxide ceramic material may be equal to the sintering temperature of the ferrite material, or according to alternative embodiments differ from the sintering temperature of the ferrite material by less than 25%, or by less than 10%, or by less than 5%. Magnetic properties may comprise magnetic permeability, core losses, saturation flux density, and the like. The two materials are alternately filled into the mold 120 such that regions 142 and 144 of one ferrite material each and one oxide ceramic material are formed. As shown in FIG. 1, the regions 142 and 144 are alternately arranged. The regions 142 and 144 of ferrite material and oxide ceramic material thus fill a volume in the mold 120 such that a material volume 140 is provided in the mold 120. According to some embodiments, the regions 142 and 144 in the material volume 140 may be provided as alternating regions which are arranged in alternating layers, one upon the other. In other alternative embodiments, spacer elements may be provided perpendicularly to one or several layers so as to form, as an alternative or in addition to regions formed one upon the other, regions disposed one besides the other. Suited spacer elements may be conductive or insulating plates, small plates or the like.

To produce a magnetic core according to an alternative embodiment, two ferrite materials having different magnetic properties are provided. Magnetic properties may comprise magnetic permeability, core losses, saturation flux densities, and the like. This alternative embodiment is also described below with reference to FIG. 1. The two ferrite materials are alternately filled into the mold 120 such that regions 142 and 144 of one ferrite material each are formed. The regions 142 and 144 are alternately arranged, as shown in FIG. 1. The regions 142 and 144 of a first and a second ferrite material thus fill a volume in the mold 120 such that a material volume 140 is provided in the mold 120. According to some embodiments, the regions 142 and 144 in the material volume 140 may be provided as alternating regions which are arranged in alternating layers one upon the other. In other alternative embodiments, spacer elements may be provided perpendicularly to one or several layers to form, as an alternative or in addition to regions disposed one upon the other, also regions disposed one besides the other. Suited spacer elements may be conductive or insulating plates, small plates, or the like.

According to some exemplary embodiments of the present invention, the second ferrite material may have, for example, a relative magnetic permeability $\mu_r$ lower than or equal to 20. According to further particular embodiments, the second ferrite material may have a relative magnetic permeability $\mu_r$ within a range of 0.99 to 10 or within a range of 5 to 10. The relative magnetic permeability $\mu_r$ is determined by the ratio of the magnetic permeability p and the magnetic field constant $\mu_0$ (where $\mu_0 = 4*\pi*10^\wedge(-7)(Vs/Am)$, i.e. to $\mu_r = \mu/\mu_0$.

After the filling of the mold 120 and the forming of the material volume 140, the material volume 140 is exposed to pressure. This may be done during a light pressing operation, for example a pre-pressing for slightly compacting material and subsequently further filling the mold, or a pressing operation for producing a solid material block. Pressure may be exerted by the press 110, where a die (not represented) of the press 110 exerts a force along a direction 150 onto a surface of the region 142 exposed in the mold to thus subject a pressure onto the material volume 140. The direction 150 is oriented perpendicularly to the surface 142 of the region 142.

The exposure to pressure reduces the material volume 140. According to one embodiment, the exposure to pressure may reduce the material volume 140 to less than 90% of the material volume. According to further embodiments, the exposure to pressure may reduce the material volume 140 to less than 50% of the material volume. According to further embodiments, the exposure to pressure may reduce the material volume 140 to maximally 10% of the material volume.

Pressure may be exerted, for example, during a dry pressing. The mold 140 may be subjected to a heat supply during the exposure to pressure such that the material volume 140 is exposed to heat and heats up. For this, the mold 120 may be made of a material which has correspondingly advantageous thermal conductivity and/or diffusivity properties. In some embodiments, the exposure to heat may be effected before the exposure to pressure. According to alternative embodiments, the exposure to heat may be effected after the exposure to pressure. According to alternative embodiments, the exposure to heat may be effected simultaneously with the exposure to pressure. Heating elements (not represented) for generating heat may be provided outside the mold 120 or may be integrated in the mold. The mold 120 may also be designed for accommodating heating elements or have coupling regions for coupling with heating elements. The material volume 140 may be exposed to heat during a pre-sintering and/or during a sintering process. According to a specific exemplary embodiment, a pressing power of 0.5 to 5 tons/cm$^2$ may be exerted onto the material volume 140 at a pre-sintering temperature of a range of 700° C.-1200° C. For this, however, embodiments with a higher or lower pressing power and/or higher or lower pre-sintering temperatures are also conceivable.

The different materials, for example ferrite materials and/or oxide ceramic materials, may be subjected to a pre-sintering process before the mold 120 is filled. The pre-sintered regions may be alternately arranged in the mold and be subjected to a further sintering process, so that the amount of pre-sintered material is sintered in a combination together. An optional pulverization of the pre-sintered material may follow the pre-sintering process, wherein a particle fineness of the material may be adjusted. The pulverized material is subsequently formed into grains in a spraying process. By this, it may be ensured that the mold 120 is filled with material of a predetermined composition and granularity. Thereby, an advantageous desired strength may be adjusted for the magnetic core under fabrication.

According to a specific exemplary embodiment, heat is supplied after pressure is exerted. The material volume 140 pressed when exposing to pressure may be exposed to heat during a pre-sintering and/or a sintering process. During sintering, the pressed material volume 140 may be subjected to temperatures of 800° C. to 1600° C. Before sintering, the pressed material volume 140 is taken out of the mold 120 and disposed in a suited oven (not represented). Subsequently, the pressed material volume 140 in the oven (not represented) is exposed to heat for sintering.

While the mold 120 represented in FIG. 1 is filled with two ferrite materials having different magnetic properties, the present invention is not limited to two ferrite materials. According to further not represented embodiments, three ferrite materials with different magnetic properties, four ferrite materials with different magnetic properties, or more than four ferrite materials with different magnetic properties may be used. Moreover, the ferrite materials may have different magnetic properties in pairs (two ferrite materials each have the same magnetic properties, or in general 3 or more of the different ferrite materials each have the same properties).

The provided ferrite materials may be selected such that the selected ferrite materials comprise different Curie temperatures and/or different heat conductivities and/or different thermal diffusivities and/or different electric conductivities and/or different magnetic resistances and/or different magnetic properties.

According to some embodiments, a selection of appropriate ferrite materials with different Curie temperatures and a corresponding filling of the mold 120 with a subsequent exposure to pressure and heat result in magnetic cores with a predetermined temperature dependency of the inductance and the magnetic permeability and the magnetic resistance and the saturation behavior. For example, a selection of ferrite materials may be adapted with respect to different Curie temperatures to expected operation temperatures and/or ambient temperatures of the magnetic core. Thereby, an inductance of the magnetic core as desired during operation and/or a change of the magnetic permeability and/or a desired saturation behavior along the length and/or across a cross-section of the magnetic core, and/or a change of the magnetic resistance across the magnetic core may be adjusted.

The ferrite materials may be selected according to further embodiments with respect to desired thermal and/or electric and/or mechanical properties. It is thus possible that in selecting certain ferrite materials, according thermal and/or electric properties of the core are adjusted such that a thermal conductivity in the magnetic core, or heat transfer in the magnetic core, or a thermal diffusivity of the magnetic core, or an electric conductivity of the magnetic core, or a certain strength of the magnetic core are adjusted. It is thus possible to provide magnetic cores that comprise an advantageous heat dissipation and/or suppression of electric current flows through the magnetic core. The person skilled in the art will appreciate that with the suppression of current flows through the magnetic core, further heating of the magnetic core is also prevented.

Mechanical and/or magnetic and/or thermal and/or electric properties of provided ferrite materials may be further influenced by the addition of additives. For this, at least one additive is added to at least one ferrite material before exposure to pressure. A non-restricting list of possible additives may comprise titanium (Ti), aluminum (Al), chromium (Cr), magnesium (Mg), copper (Cu), nickel (Ni), tin (Sn), germanium (Ge), strontium (Sr), sodium (Na), potassium (K), zinc (Zn), iron (Fe), manganese (Mn) as well as oxides and carbonates of these elements or further chemical compounds. As possible oxides, one can mention illustratively and by way of example $TiO_2$, $Al_2O_3$, $Cr_2O_3$, MgO, CuO, NiO, $SnO_2$, $GeO_2$, SrO, however, without limiting the present disclosure only to these. These additives may be built into the spinel grid of at least one ferrite material to ensure a desired fine tuning of mechanical and/or magnetic properties of the at least one ferrite material. Within the frame of mechanical properties adjusted besides the desired magnetic properties, an adjustment of thermal and/or electric properties may also be effected.

According to some exemplary embodiments, an adjustment of thermal coefficients of linear expansion of the different ferrite materials may be effected. Thus, the coefficients of linear expansion of the different ferrite materials may be adapted to each other such that the different coefficients of linear expansion differ from each other by less than 10% or by less than 5% or by less than 1% or by less than 0.5%. By an adjustment of the coefficients of linear expansion, an advantageous stability of the magnetic core may be ensured, so that a tearing or breaking of the magnetic core due to different expansion behaviors during heating is reliably suppressed.

Exposure to pressure may be effected by means of a CNC-controlled hydraulic press. According to exemplary embodiments, a powder press may be provided for this. According to alternative embodiments, corresponding to an exemplary technical realization, a CNC-controlled hydraulic press with double-feed shoe system may be provided, where a double-feed shoe system consists of two different feed shoes which transport different powders. Equally, a single feed shoe is conceivable which switches between two types of powder.

At least one of the provided ferrite materials may furthermore comprise a substance amount fraction of ZnO within a range of 0 mol % to 60 mol %. In addition or as an alternative, the ferrite material $Fe_2O_3$ may have a substance amount fraction within a range of 20 mol % to 80 mol %. It should be noted that the Curie temperature of a ferrite material may be influenced, among other things, by a change of a substance amount fraction of ZnO, i.e. starting from the Curie temperature of a ferrite material, an adjustment of the Curie temperature to a desired value may be effected by adjusting a proportion of ZnO in the ferrite material. In particular, with an increase of the proportion of ZnO, the Curie temperature may be reduced. Moreover, by means of a predetermined substance amount fraction of ZnO and/or $Fe_2O_3$ and/or MnO and/or NiO, a desired electric resistance of the ferrite material may be adjusted.

According to an exemplary embodiment, a ferrite material may have a substance amount fraction of 35 mol % of ZnO, 48 mol % of $Fe_2O_3$, and 17 mol % or less of MnO and/or NiO.

In addition to that, further additives and doping agents may be provided. A corresponding ferrite material has a Curie temperature of approx. −40° C.

According to a further exemplary embodiment, a ferrite material may have a substance amount fraction of 5 mol % of ZnO, 54 mol % of $Fe_2O_3$, and 41 mol % or less of MnO and/or NiO. In addition to that, further additives and doping agents may be provided. A corresponding ferrite material has a Curie temperature of approx. −270° C.

According to a further exemplary embodiment, a ferrite material may be a nickel-zinc-ferrite with a relative magnetic permeability of 10, and a further ferrite material may represent a manganese-zinc-ferrite with a relative magnetic permeability of 1800.

According to some exemplary embodiments, ferrite materials with a low Curie temperature are provided. Here, the term "low Curie temperature" is to be understood as meaning a Curie temperature within a range of less than 100° C. Further illustrative embodiments here comprise ferrite materials with a low Curie temperature whose Curie temperature is 30° C. or less. According to other exemplary embodiments, ferrite materials with Curie temperatures of −250° C. to 0° C. may be provided.

According to some exemplary embodiments, ferrite materials with a high Curie temperature are provided. Ferrite materials with a "high Curie temperature" are to be understood here as designating ferrite materials with a Curie temperature of more than 100° C. According to some exemplary embodiments, these ferrite materials may comprise a Curie temperature within a range of 100° C. to 700° C., or of 100° C. to 500° C., or of 200° C. to 350° C.

According to an exemplary alternative embodiment of the present invention, a ferrite material is provided as a first material, and a composite material of nanoscale particles is provided as a second material. From the provided first material, individual pieces are made by pressing and sintering. For producing a core, the second material is introduced between two individual pieces each, so that successively individual pieces are connected to each other by means of the second material. For example, the connection may be established by an adhesive. It should be noted that preferred composite materials have a superparamagnetic behavior. According to exemplary embodiments, suited nanoscale particles have a maximum diameter and/or a maximum length in an extension direction within a range between 5 nm and 50 nm, or preferably between 5 nm and 20 nm, or further preferred between 5 nm and 10 nm. According to specific exemplary embodiments of this exemplary alternative embodiment, suited nanoscale particles may be provided by ferrite material. According to further specific exemplary embodiments, nanoscale particles may comprise of metal (e.g. as small as 5 nm to 50 nm) which may be, for example, embedded in a silicon dioxide shell. According to a further illustrative development of this embodiment, a bonding agent, e. g. thermoplastics or thermosetting plastics, may be blended with the ferrite crystals and/or metal crystals. For example, an admixture of nanoscale particles to an adhesive may be less than 20% or less than 10% or up to 99%. According to these exemplary alternative embodiments, the provided second material has a relative permeability Pr to which the following applies: $1<\mu_r<3$, preferably $1<\mu_r<2$, further preferred $1<\mu_1<1.6$, further preferred $1<\mu_r<1.3$.

According to a further exemplary alternative embodiment, a technique for connecting two ferrite materials is disclosed with reference to FIG. 2. The first material volume 220A and the second material volume 240A are pressed as single pieces. A liquid is applied onto the upper side of an exposed surface of the first material volume 220A. According to illustrative embodiments, the liquid may be an aqueous or alcoholic solution of polyethylene glycol or polyvinyl alcohol or acrylate. By the applied liquid, ferrite material is dissolved at the exposed surface of the material volume 220A such that a film of loose ferrite particles is formed on the exposed surface of the material volume 220A. Thereupon, a further region may be arranged on the film. For example, the further region may be formed by an element of pre-sintered ferrite material or a tablet of ferrite material. A surface of the region disposed above the film which gets into contact with the film is partly dissolved by the film such that ferrite material from the region disposed above the film go into solution. Thereby, a connection is formed between the material volume 220A disposed under the film and the region disposed above the film. By the subsequent exposure to heat, for example in a sintering process, a form-fit connection is created. According to exemplary embodiments, in the forming of the region above the film, an arrangement of the region above the film with rotation of the region performed during the arrangement.

It should be noted that the above illustrated techniques are not limited to two different materials. According to alternative embodiments, more than two materials of different magnetic properties may also be provided. Moreover, the above illustrated technique may be performed repeatedly to thus gradually connect individual regions to each other and/or extend magnetic cores or attach additional regions to a magnetic core.

Figure 2A:
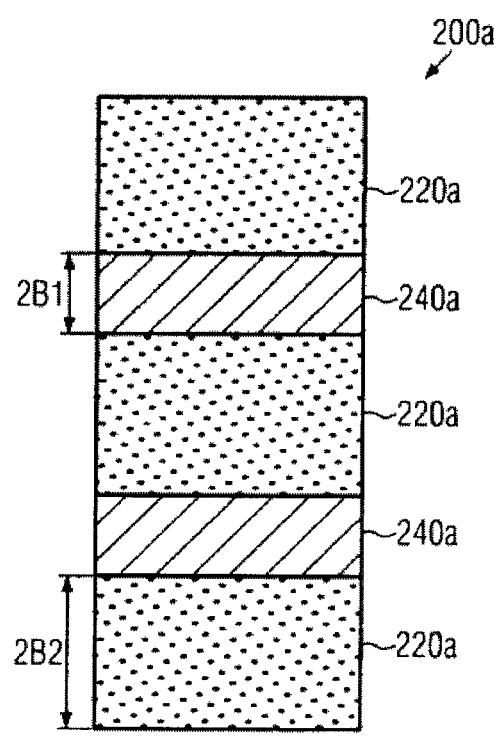
FIG. 2A schematically shows a cross-sectional view of a magnetic core according to an embodiment of the invention.

With reference to FIGS. 2A to 2D, illustrative examples of magnetic cores will be illustrated below according to some exemplary embodiments. FIG. 2A schematically shows a cross-sectional view of a magnetic core 200A along a direction of extension or a longitudinal direction of the magnetic core 200A. The magnetic core 200A has alternately arranged regions 220A and 240A of ferrite materials with different magnetic properties. As illustrated above, magnetic properties may comprise, for example, an inductance, and/or a magnetic permeability, and/or a magnetic resistance, and/or core losses, and/or a saturation flux density. The regions 220A and 240A are arranged alternately along the longitudinal direction or the direction of extension of the magnetic core 200A. While the regions 220A and 240A in FIG. 2A are represented as a layer extending over the complete cross-section of the magnetic core 220A, this is no limitation to the present disclosure. It should be noted that alternative embodiments, where not all regions are embodied as layers extending over the complete cross-section of the magnetic core, are also conceivable. For example, regions which do not extend over the complete cross-section of the magnetic core may be explicitly provided, as was illustrated above with reference to FIG. 1.

The regions 220A of the magnetic core 200A shown in FIG. 2A are regions of a high Curie temperature. Here, as stated above, the term "high Curie temperature" is to be understood as a Curie temperature that is higher than 100° C.

The regions 240A of the magnetic core 220A are, according to an exemplary embodiment, regions with a low Curie temperature, where the term "low Curie temperature" means a Curie temperature of up to 100° C. According to an alternative embodiment, the regions 240A comprise an oxide ceramic material. According to a further alternative embodiment, the regions 240A comprise nanoscale particles and exhibit a superparamagnetic behavior.

The regions 240A represent so-called "sintered-in gaps" in the core 200A. By providing these sintered-in gaps, a premature saturation of the magnetic core 200A may be prevented.

The regions 240A furthermore have a width 2B1. The regions 220A have a width 2B2. According to an embodiment, the width 2B2 of the regions 220A is greater than the width 2B1 of the regions 240A. Thereby, the magnetic resistance is set to a small value.

The magnetic core 200A exhibits an optimized guidance of lines of force in the core, i.e. bulges of the lines of force are preferably suppressed in the core when using a material having a permeability of higher than 1 (e. g. 1.3). The air gaps must be increased by about the factor of the relative permeability to adjust the same magnetic resistance one would obtain for a "real air gap". The permeability of this "air gap material", however, is not to be too high as otherwise the magnetic circle would prematurely go into saturation because the magnetic resistance decreases and the air gaps may not be arbitrarily increased. Therefore, permeabilities of 1-3 prove to be advantageous. In conventional cores with distributed air gaps, the lines of force are deformed due to the higher magnetic resistance of the air gaps such that bulges occur. In comparison, an optimal guidance of the lines of force in the core in accordance with the invention is to be understood as meaning a course of the lines of force where tangents to the lines of force comprise a component along a direction perpendicular to the longitudinal direction of the core which component is smaller, with respect to the component along the longitudinal direction, by at least a factor of 1.5 or by at least a factor of 3.5 or by at least a factor of 5. This results in the lines of force being better kept in the proximity of the core and in less bulges occurring. For this reason, the air-gap induced eddy current losses in the copper lines are reduced.

The person skilled in the art will appreciate that the present disclosure is not limited to the above mentioned widths. According to alternative embodiments, the width 2B2 of the regions 220A may be smaller than the width 2B1 of the regions 240A, or both widths may be equal.

While FIG. 2 shows an embodiment in which the regions 220A have a common width 2B2 and the regions 240A have a common width 2B1, which does not pose any limitation on the present disclosure. Alternative embodiments to that shown in FIG. 2A are also possible where different regions of the same ferrite material may have different widths, for example, at least two different widths each may vary by more than 1% or by more than 5% or by more than 10% or by more than 25% or by more than 50%. According to this alternative embodiment, inaccuracies in a winding to be disposed over the core may be compensated, for example a misalignment of the winding with respect to the core etc.

According to other embodiments, widths of regions 240A may have a width that depends on a distance to an end of the magnetic core 200A. For two regions 240A, for example, a first region may comprise a first distance to an end of the magnetic core 200A to which the first region has the smaller distance (compared to the other end) and a first width, and a second region may comprise a second distance to one end of the magnetic core 200A to which the second region has the smaller distance (compared to the other end), and a second width, the first width being smaller than the second width if the first distance is smaller than the second distance, and the first width being greater than the second width if the first distance is greater than the second distance.

Figure 2B:
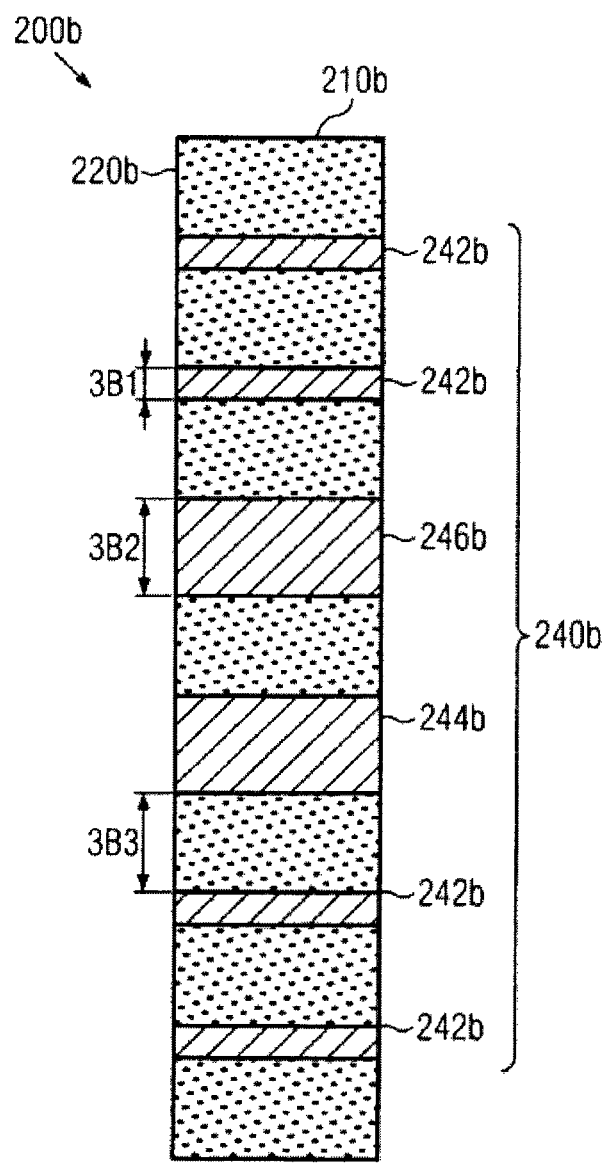
FIG. 2B schematically shows a cross-sectional view of a magnetic core according to a further embodiment of the invention.

FIG. 2B shows a cross-sectional view of a magnetic core 200B along a longitudinal direction or a direction of extension of the magnetic core 200B. Along the longitudinal direction or the direction of extension of the core 210B, alternating regions 220B and 240B with ferrite material of different magnetic properties are arranged. In FIG. 2B, the regions 220B and 240B are shown as layers extending over the complete cross-sectional area of the magnetic core 210B which are alternately arranged along the longitudinal direction or the direction of extension of the magnetic core 210B.

The person skilled in the art will appreciate that despite the regions represented in FIG. 2B as layer that extends over the cross-section of the magnetic core, alternative embodiments are also conceivable in which at least two regions do not extend over the complete cross-section of the magnetic core, as was illustrated above with reference to FIG. 1.

Furthermore, the magnetic core 200B has edge-sided surfaces 210B. The edge-sided surfaces 210B form dynamic poles of the magnetically soft core when a magnetic field is present and represent surfaces of regions 220B which are correspondingly in contact with one of the regions 240B only on one side. Below, the edge-sided surfaces 210B will be referred to as "edge".

As is shown in FIG. 2B, the regions 220B have a width 3B3. The regions 240B comprise regions 242B with a width 3B1 and regions 244B with a width 3B2. According to exemplary embodiments, the width 3B1 is smaller than the width 3B2. Corresponding to the embodiment represented in FIG. 2B, the width of regions 240B along a longitudinal direction or a direction of extension of the core 200A decreases towards the edge of the magnetic core 200B, where regions 246B disposed in a central region of the magnetic core 200B are greater than regions 242B located at an edge 210B. The width 3B3 of the regions 240B is independent of the arrangement of the individual regions 240B. Here, the distance of a region to an edge 210B is to be understood as the distance of a region in the longitudinal direction of the core 200A to the edge 210B which has the smallest distance from the region. It is possible to measure distances from an edge of a region or a surface of a region determining the region's boundary of the region to a directly adjoining region, however, the person skilled in the art will see that another suited reference point, such as a geometric centroid of a region, may equally be provided for measuring distances if the reference point is defined analogously for each region. Below, regions will, with respect to the distance and/or arrangement, still relate to the edge 210B which has the smaller distance from the region, and will be measured from the region's boundary of a region which is arranged closest to the corresponding edge 210B.

According to exemplary embodiments, the width 3B3 may be greater than or equal to the width 3B2. According to alternative embodiments, the width 3B3 may be smaller than or equal to the width 3B2.

According to an exemplary embodiment, regions 240B are made of ferrite material with a low Curie temperature. Here, the term "low Curie temperature" is to be understood as meaning a Curie temperature of less than or equal to 100° C. According to an alternative embodiment, the regions 240B comprise an oxide ceramic material. According to a further alternative embodiment, the regions 240B comprise nanoscale particles and exhibit a superparamagnetic behavior.

The regions 220B are made of a material with a high Curie temperature. Here, the term "high Curie temperature" means that the Curie temperature is higher than 100° C.

Thereby, a magnetic core 200B is provided which has so-called "sintered-in gaps". By the sintered-in gaps, a premature saturation of the magnetic core 200B may be reliably prevented.

By the regions 240B with decreasing widths provided in the magnetic core 200B, which regions are of low permeability, stray fields laterally of the magnetic core 200B are reliably suppressed. In particular, "bulges" of the magnetic field occurring at the edges 210B of the magnetic core 200B are suppressed by the regions 242B to a greater extent. Since the regions 244B are often covered by a winding disposed above the magnetic core 200B, a magnetic field strength around the regions 244B is very high in these regions 220B. Thereby, a bulging of the magnetic field at the regions 244B is reliably suppressed. These regions may have a greater width. According to exemplary embodiments, at least two different widths each may vary by at least 1% or at least 5% or at least 10% or at least 25% or at least 50%.

It should be noted that the embodiment shown in FIG. 2B also shows an optimal guidance of the lines of force in the core. Corresponding illustrations also apply here to their full extent.

While the magnetic core 200B shown in FIG. 2B represents regions 220B with the same width 3B3, regions 244B with the same width 3B2, and regions 242B with the same width 3B1, the present disclosure is not limited thereby. As an alternative, embodiments are conceivable in which different regions 220B may have different widths, for example, the regions 220B may become smaller or larger towards the edges. In addition or as an alternative, different regions 244B may have different widths. In addition or as an alternative, different regions 242B may have different widths.

According to other exemplary embodiments, widths of regions 240B may have a width depending on a distance to the edge 210B of the magnetic core 200B. For two regions 240B, a first region may have, for example, a first distance to the edge 210B of the magnetic core 200B and a first width, and a second region may have a second distance to the edge 210B of the magnetic core 200B and a second width, the first width being smaller than the second width if the first distance is smaller than the second distance, and the first width being greater than the second width if the first distance is greater than the second distance.

Figure 2C:
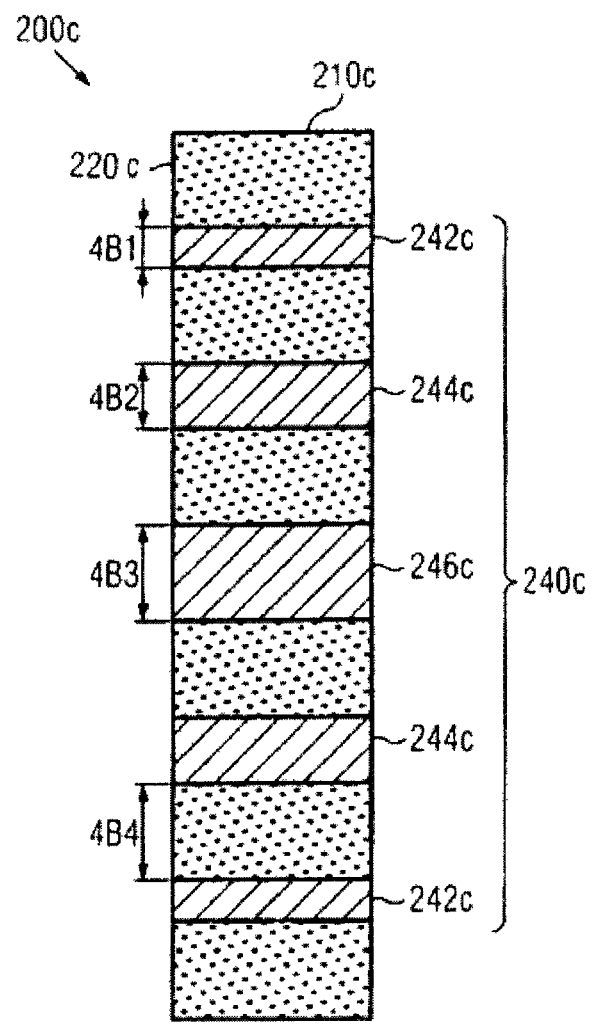
FIG. 2C schematically shows a cross-sectional view of a magnetic core according to a further embodiment.

FIG. 2C shows a cross-sectional view of a magnetic core 200C along a longitudinal direction or a direction of extension of the magnetic core 200C. The magnetic core 200C has regions 220C and regions 240C, i. e. 242c, 244c and 246c, which are each formed of ferrite materials with different magnetic properties (corresponding embodiments were described with respect to FIGS. 2A and 2B, so that reference is made to the corresponding description). This means that the ferrite material forming the regions 220C has magnetic properties that differ from the magnetic properties of the ferrite material forming the regions 240C. As illustrated above, the magnetic property may comprise an inductance, a magnetic permeability, a magnetic resistance, a Curie temperature, a saturation flux density, etc. According to an alternative embodiment, the regions 240A comprise an oxide ceramic material. According to a further alternative embodiment, the regions 240C comprise nanoscale particles and exhibit a superparamagnetic behavior.

The magnetic core 200C furthermore has edge-sided surfaces 210C. The edge-sided surfaces 210C form dynamic poles of the magnetically soft core when a magnetic field is present and represent surfaces of regions 220C which are correspondingly in contact with one of the regions 240C only on one side. Below, the edge-sided surfaces 210C will be referred to as "edge". The distance of a region to an edge 2100 is to be understood as the distance to the edge 210C which has the smallest distance from the region. Below, regions shall also relate to the edge 210C having the smaller distance from the region with respect to the distance and/or arrangement.

The regions 220C have a width 4B4. The regions 240C comprise regions 242C with a width 4B1, regions 244C with a width 4B2, and a region 246C with a width 4B3. According to exemplary embodiments, the width 4B3 may be greater than the width 4B2. The width 4B2 may in turn be greater than the width 4B1. In the embodiment represented in FIG. 2C, the width 4B4 may be at least as large as the width 4B3.

According to alternative embodiments, the width 4B4 may be smaller than the width 4B3, or even smaller than the width 4B2, to form at least one large "gap" in the magnetic core 200C. It should be noted that instead of a region 246C, two or more regions 246C may also be provided. It should be furthermore noted that the number of regions 242C and/or 244C may differ from the respective number shown in FIG. 2C, so that also two or more regions 242C and/or two or more regions 244C and a corresponding number of regions 220C may be provided.

It should be noted that the embodiment shown in FIG. 2C also comprises an optimal guidance of the lines of force in the core. Corresponding illustrations also apply here to their full extent.

According to an exemplary embodiment, the magnetic core 200C has regions 240C whose widths decrease towards the edge 210C of the magnetic core 200C.

According to exemplary embodiments, the regions 220C are made of a material with a high Curie temperature. The term "high Curie temperature" is to be understood as designating Curie temperatures that are higher than 100° C.

According to exemplary embodiments, the regions 240C are made of a ferrite material with a low Curie temperature. The term "low Curie temperature" is to be understood as designating Curie temperatures of lower than or equal to 100° C.

While the magnetic core 200C shown in FIG. 2C represents regions 220C with the same width 4B4, regions 244C with the same width 4B2, and regions 242C with the same width 4B1, the present disclosure is not limited thereby. As an alternative, embodiments are conceivable in which different regions 220C may have different widths, for example, the regions 220C may become smaller or larger towards the edges. In addition or as an alternative, different regions 244C may have different widths. In addition or as an alternative, different regions 242C may have different widths. According to exemplary embodiments, at least two different widths each may differ by at least 1% or at least 5% or at least 10% or at least 25% or at least 50%.

According to other exemplary embodiments, widths of regions 240C may have a width depending on a distance to the edge 210C of the magnetic core 200C. For two regions 240C, a first region may have, for example, a first distance to the edge 210C of the magnetic core 200C and a first width, and a second region may have a second distance to the edge 210C of the magnetic core 200C and a second width, the first width being smaller than the second width if the first distance is smaller than the second distance, and the first width being greater than the second width if the first distance is greater than the second distance.

Figure 2D:
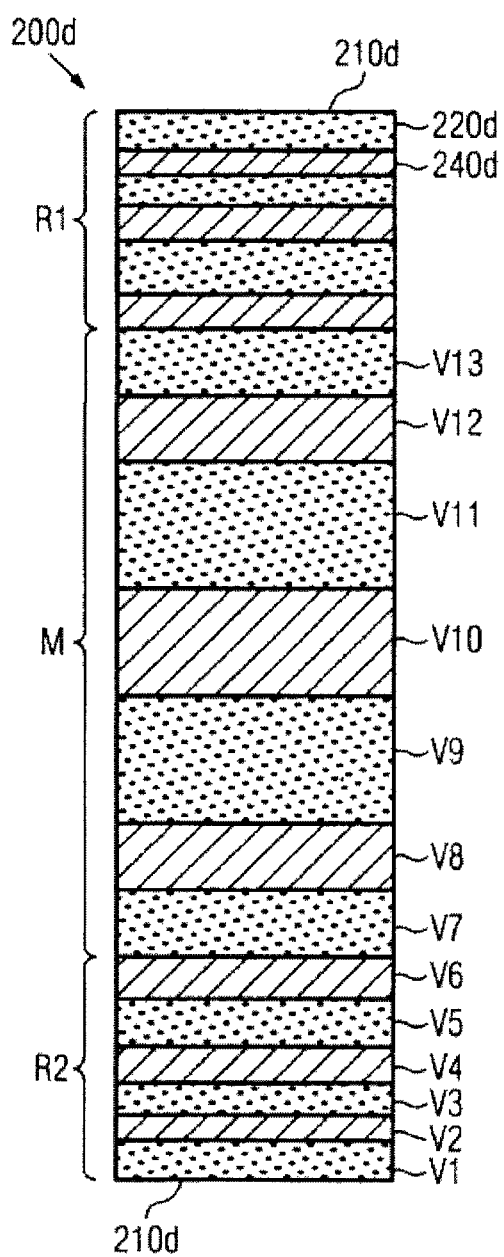
FIG. 2D schematically shows a cross-sectional view of a magnetic core according to a further embodiment.

FIG. 2D shows a cross-sectional view of a magnetic core 200D along a longitudinal direction or a direction of extension of the magnetic core 200D. The magnetic core 200D has regions 220D and regions 240D. At this point, reference is made to the embodiments of FIGS. 2A to 2C with respect to the corresponding regions 220A, 220B, 220C, 240A, 240B, 240C.

According to exemplary embodiments, the regions 220D are made of a ferrite material with a high Curie temperature. The term "high Curie temperature" designates a Curie temperature of higher than 100° C.

According to exemplary embodiments, the regions 240D are made of a ferrite material with a low Curie temperature. The term "low Curie temperature" designates Curie temperatures of lower than or equal to 100° C. According to an alternative embodiment, the regions 240D comprise an oxide ceramic material. According to a further alternative embodiment, the regions 240D comprise nanoscale particles and exhibit a superparamagnetic behavior.

This does not represent any restriction of the present disclosure. It should be noted that according to alternative embodiments, the regions 220D and 240D may be made of materials that differ with respect to their magnetic properties and/or with respect to their thermal properties and/or with respect to their electric properties. Magnetic properties may comprise an inductance, a magnetic permeability, a magnetic resistance, a core loss, a saturation flux density, etc.

The magnetic core 200D furthermore has edge-sided surfaces 210D. The edge-sided surfaces 210D form dynamic poles of the magnetically soft core when a magnetic field is present and represent surfaces of regions 220D which are correspondingly in contact with one of the regions 240D only on one side each. Below, the edge-sided surfaces 210D will be referred to as "edge". The distance of a region to an edge 210D is to be understood as the distance to the edge 210D which has the smallest distance from the region. Below, regions will relate to the edge 210D having the smaller distance from the region with respect to the distance and/or arrangement. A reference point for each region is to be defined corresponding to deliberations stated above, so that a distance of a region to the edge may be measured.

The magnetic core 200D is divided into three sections: Two sections R1 and R2 designate sections which each comprise one edge 210D. A section M is arranged between the two sections R1 and R2, so that one end each of the section M is in contact with one of the sections R1 and R2. The section R2, as it is shown in FIG. 2D, comprises regions 220D having volumes V1, V3, and V5. According to exemplary embodiments, volumes V1 and V3 are equal, while volume V5 is larger than V1 or V3.

It should be noted that this is no restriction of the present disclosure. According to alternative embodiments, volumes V1 and V3 of different dimensions are also conceivable, for example, volume V3 may be larger than volume V1, volume V3 being smaller than volume V5.

Regions 240D in section R2 have volumes V2, V4 and V6 of the same dimensions. It should be noted that this is no restriction of the present disclosure. Alternative embodiments where volumes V2, V4 and V6 have different dimensions are also conceivable, for example, V2 may be smaller than V4 which is smaller than V6.

R1 may have a configuration corresponding to section R2.

Section M has regions 210D comprising volumes V7, V9, V11, and V13. Here, volumes V9 and V11 are greater than volumes V7 and V13. According to exemplary embodiments, volumes V13 and V7 or volumes V11 and V9 have the same dimensions. According to alternative embodiments, volumes V7 and V13 or V9 and V11 may have different dimensions.

According to alternative embodiments, volumes V9 and V11 may at most be as large as volume V10.

The regions 240D of section M have volumes V8, V10, and V12. According to exemplary embodiments, volume V10 is larger than volumes V8 and V12. According to other exemplary embodiments, volumes V8 and V12 may have the same dimensions. As an alternative, volumes V8 and V12 may have different dimensions.

The magnetic core 200D shown in FIG. 2D has, according to exemplary embodiments, regions 240D whose volumes may all be smaller than the largest volume of the regions 220D. A volume, and correspondingly a size, of each one of the regions 240D may be smaller than or equal to a volume, and thus a size, of the smallest directly adjoining region 220D, e. g. V2 is smaller than V1, V3; V4 is smaller than or equal to V3 smaller than V5; V6 is smaller than V5, V7; V8 is smaller than or equal to V7 smaller than V9; V10 is smaller than V9, V11; V12 is smaller than or equal to V13 smaller than V11, etc.

According to a specific exemplary embodiment, the core 200D is configured such that volumes V10, V8, V6, V4, V2 decrease along a longitudinal direction or a direction of extension of the core 200D towards the edge 210D. It should be noted that a decrease may be defined according to the requirements on the core 200D. For example, a linear interrelationship between the decrease of the volumes towards the edge with an increasing distance from a centroid of the core 200D or with a decreasing distance towards the edge 210D may be determined. As an alternative, a logarithmic relationship, an exponential relationship, or any other suited relationship, formed of a chaining of different functions, may be provided, so that the chaining parameterizes a monotonously falling or strictly monotonously falling behavior along the longitudinal direction of the core. The person skilled in the art will appreciate that the selection of a suited interrelationship may depend on the performance requirements and the desired properties of the core under fabrication. For example, on the basis of a desired course of the lines of force in the core, a suited function may be determined by means of numerical methods. The other core half may be correspondingly configured, so that a symmetric core configuration results. This, however, does not represent any restriction, so that asymmetric core configurations are also conceivable.

It should be noted that the embodiment shown in FIG. 2D also comprises an optimal guidance of the lines of force in the core. Corresponding illustrations also apply at this point to their full extent.

With reference to FIG. 2D, region dimensions have been correlated with the volume. This does not pose any limitation. According to other embodiments, in the description to FIG. 2D, the term "volume" may be replaced by "width" and its meaning is to be understood as the width of a region.

With reference to FIGS. 1 and 2A to 2D, embodiments were described in which two ferrite materials have different Curie temperatures. This does not pose any limitation on the present disclosure. The embodiments described with respect to these figures may be transferred without restrictions to situations where the ferrite materials with a low Curie temperature are replaced by materials with a low magnetic permeability and/or a low saturation flux density, and the ferrite materials with a high Curie temperature are replaced by materials with a high magnetic permeability and/or a high saturation flux density. A corresponding description directly results from a corresponding replacement.

With reference to FIGS. 2A to 2D, embodiments were described where two ferrite materials with different magnetic properties form a magnetic core. This does not represent any restriction of the present disclosure. The concepts and illustrations explained with reference to FIGS. 2A to 2D may be transferred without restrictions to the cases with 3 or more ferrite materials of different magnetic properties. Reference is made to corresponding illustrations in the description to FIG. 1.

It should be noted that with respect to FIG. 2A, a technique for connecting two ferrite materials was illustrated according to which pressed single pieces are connected to each other, but this technique is also applicable for providing embodiments described in connection with FIGS. 2A to 2D.

Figure 3:
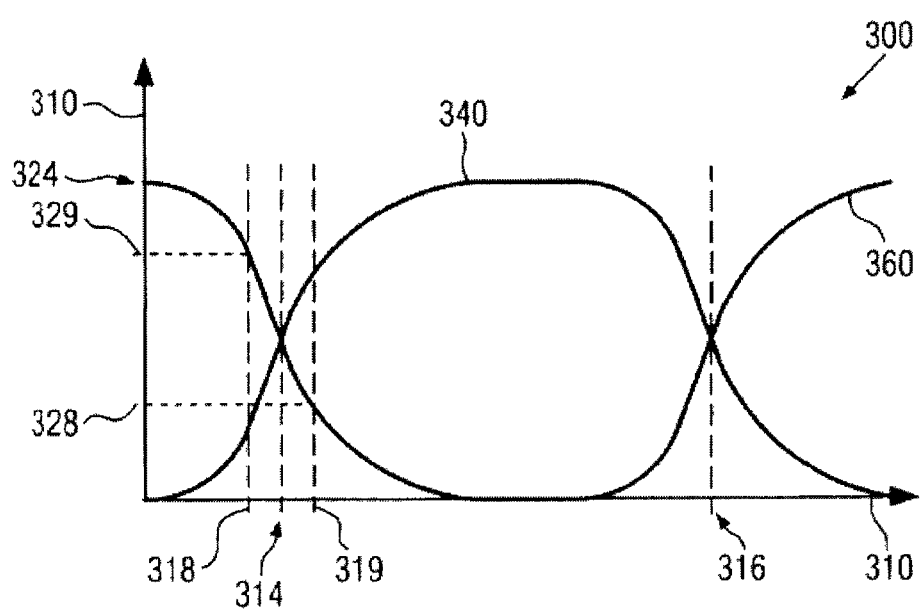
FIG. 3 schematically shows a proportion of a first ferrite material and a proportion of a second ferrite material over a region of a magnetic core according to various embodiments.

Reference is now made to FIG. 3. FIG. 3 illustrates a relation between the proportion of a first ferrite material with a first magnetic property and the proportion of a second ferrite material with a second magnetic property differing from the first magnetic property, across a region of a magnetic core. An abscissa 310 of the graph 300 represents a direction along a magnetic core comprising a nonvanishing component along a longitudinal direction or a direction of extension of the magnetic core. An ordinate 320 of the graph 300 represents a weight or substance amount fraction. The ordinate 320 may comprise units standardized in such a manner that a point 324 on the ordinate 320 corresponds to a mass or substance amount fraction of 100% or 1. A point 329 on the ordinate 320 may correspond to a mass or substance amount fraction, measured in percent, of more than 95% or more than 90% (or more than 0.95 or more than 0.90). A point 328 on the ordinate 320 may correspond to a mass or substance amount fraction with the unit percent of less than 30% (or 0.30) or less than 10% (or 0.10) or less than 5% (or 0.05) or less than 1% (or 0.01). In this context it should be noted that the graph 300 is only schematic and serves for illustrating the term border of regions.

A curve 340 of the graph 300 represents the mass or substance amount fraction of the first ferrite material. A curve 360 of the graph 300 represents the mass or substance amount fraction of the second ferrite material in the above mentioned direction along a magnetic core across a region.

As can be taken from the graph 300 shown in FIG. 3, the curve 360 of the second ferrite material is strictly monotonously falling in an interval in which the curve 340 is strictly monotonously rising. This means that in this interval in the direction along the magnetic core, a decrease of the substance amount fraction or mass fraction at the second ferrite material is effected with a simultaneous increase of the substance amount fraction or mass fraction of the first ferrite material. The curves 340 and 360 intersect in this interval in a point, so that both ferrite materials have an identical mass or substance amount fraction at this point. As can be taken from FIG. 3, the mass or the substance amount fraction of a ferrite material between two intersecting points each is always higher than the mass or substance amount fraction of the other ferrite material. So, these regions may be interpreted to the effect that in this region, mainly a ferrite material with a certain magnetic property is present, while the other ferrite material with differing magnetic properties shows a decreasing mass or substance amount fraction into this region. For this reason, a region is defined between the two intersecting points 314 and 316 which is formed of the first ferrite material since the first ferrite material has a mass or substance amount fraction in this region that is higher than the mass or substance amount fraction of the second ferrite material (the curve 340 extends between the points 314 and 316 over the curve 360). Since in a region of the first ferrite material, a proportion of second ferrite material is also present, the regions are actually not absolutely strictly separated from each other (this would correspond to a step-like course, for example the so-called Heaviside function). Embodiments of the present invention, however, show relatively strictly separated regions in which boundary regions correspond to narrow intervals (e. g. 318 to 319 in FIG. 3) around boundary lines (e. g. broken line over 314 in FIG. 3). A boundary region is defined in connection with the present disclosure as a region in which the mass fraction of a ferrite material decreases from a value on the ordinate, for example corresponding to point 329, to another value on the ordinate, for example corresponding to point 328. This leads to an interval around point 314 on the abscissa 310 which is limited by points 318 and 319, and thus to a boundary region between two regions.

It turned out within the frame of the present invention that boundary regions defined corresponding to the concept represented in FIG. 3 are narrow or sharp, or that two regions are well separated from each other.

According to an exemplary embodiment, a good separation of two regions or narrow or sharp boundary regions is achieved by ensuring that the loose bulks are already well separated before pressing. This may be achieved, for example, by leveling the feed shoe. It may be furthermore ensured that a good separation is also maintained during temperature treatment if the mutual diffusion is kept preferably low. This is achieved according to specific embodiments by selecting the different material composition of the different materials to be as narrow as possible. Furthermore, a use of preliminary annealed or sintered or reacted powder may involve further local "preliminary fixing" of the different materials.

Thus, it showed according to embodiments that a fraction of a partial volume of a region comprising a ferrite material, in which the mass fraction or the substance amount fraction of the ferrite material decreases from more than 90 mass or substance amount percentage or more than 95 mass or substance amount percentage to less than 30 mass or substance amount percentage or less than 10 mass or substance amount percentage, or less than 5 mass or substance amount percentage, or less than 1 mass or substance amount percentage, to a total volume of the region is less than 30% or less than 10% or less than 5% or less than 1%. The terms "narrow", "sharp", "good separation" are to be understood corresponding to the above illustration.

The present invention provides magnetic cores with regions of ferrite materials of different magnetic properties which are separated from each other more precisely than provided by prior art. Due to the sharp or clear separation, which comprises regions of ferrite materials of different magnetic properties in accordance with the invention, magnetic cores with exactly defined or given magnetic properties and/or thermal properties and/or electric properties and/or mechanical properties are provided.

With reference to FIGS. 4A and 4B, exemplary embodiments for multi-portion core arrangements are described. FIG. 4A shows a two-portion core arrangement in which a bar-type core 410A designed corresponding to the invention is combined with a conventional C- or U-type core 420A. A winding 440A is disposed over the magnetic core 410A. The winding 440A has wire ends 442A or 444*a* which may be connected to corresponding winding terminations. The winding 440A is provided over the core 410A such that a centroid of volume of the winding 440A essentially coincides with a centroid of volume of the core 410A. Essentially here means that the centroid of volume of the winding 440A is disposed over a region of the core 410A of a ferrite material which is identical to a region of ferrite material in which the centroid of volume of the core 410A is arranged. According to exemplary embodiments, the region may comprise ferrite material with a high Curie temperature. According to alternative embodiments, the region may comprise ferrite material with a low Curie temperature. Here, a high/low Curie temperature is to be understood corresponding to above illustrations. Furthermore, a winding 460A is provided over a leg of the C- or U-core 420A which is oriented to be parallel to the core 410A, the winding having two wire ends 426A and 464A. The wire ends 462A and 464A may be connected with corresponding wire terminations.

FIG. 4B shows a further embodiment of a multi-portion core arrangement in which two bar-type cores 410B and 415B are provided which are embodied corresponding to the present disclosure. Possible embodiments for bar-type cores according to the invention have been described with reference to FIGS. 2A to 2D. It should be noted that magnetic cores corresponding to the invention, as described above, may be provided as corresponding magnetic cores 410B and 415B in the magnetic arrangement 400B. The magnetic cores 410B, 4156 may be connected by means of a yoke 420B. This, however, does not pose any limitation on the present disclosure. According to alternative embodiments, the yoke may be eliminated. Over the cores 410B and 415B, windings 440B and 460B are each provided. The windings 440B and 460B have wire ends 442B and 462B which may be connected to corresponding wire terminations.

The arrangements described with reference to FIGS. 4A and 4B do not pose any limitation on the present disclosure, and arrangements with a varying number of magnetic cores of a varying number of ferrite materials of any properties in combination with any number of conventional magnetic cores is conceivable. Moreover, the shape of the core is not limiting, but arrangements based on E-, U-, I-type cores and differently shaped cores (cf. illustrations with reference to FIG. 1) and combinations thereof may be realized.

The person skilled in the art will appreciate that an edge of a magnetic core, as represented, for example, in FIGS. 2 and 4, preferably means a bordering of the core in the axial direction. In particular, the terms "edge" or "bordering" mean surfaces of the magnetic core which provide pole faces of the magnetic core in concrete applications.

The person skilled in the art will appreciate that magnetic materials within the frame of the present disclosure mainly mean magnetically soft materials and in particular ferrite-magnetic materials. The group of ferromagnetic materials used most frequently is ferrites where divalent metal ions form two grids (also referred to as subgrids) which are separated from each other by oxygen atoms lying in a close-packing of spheres (spinel structure of the ferrites).

Within the scope of the present disclosure, the following embodiments are explicitly disclosed:

Embodiment 1

Method for fabricating a magnetic core, comprising:
providing at least a first material and a second material having different magnetic properties, the first material comprising a first ferrite material and the second material comprising a second ferrite material and/or an oxide ceramic material;

filling a mold corresponding to the magnetic core for forming a material volume in the mold comprising alternately regions of at least one of the first and the second materials each; and exposing the at least two materials in the mold to a pressure.

Embodiment 2

Method according to embodiment 1, the method further comprising an additional subsequent exposure to heat.

Embodiment 3

Method according to embodiment 1 or 2, the method further comprising selecting the at least two materials such that said at least two materials comprise different magnetic permeabilities and/or different Curie temperatures and/or different thermal conductivities and/or different thermal diffusivities and/or different electric conductivities and/or different saturation flux densities.

Embodiment 4

Method according to one of embodiments 1 to 3, the method further comprising adjusting the magnetic and/or mechanical and/or thermal and/or electric property of the first material and/or the second material before exposing to a pressure by adding an additive comprising at least one of the group consisting of Ti, Al, Cr, Mg, Cu, Ni, Sn, Ge, Sr, Zn, Fe, Mn, K, Nb, Zr, Ca, Si, V, Co, Hf, W, and Bi, an oxide of one of these elements, and/or a carbonate of one of these elements, and/or any compound of these elements.

Embodiment 5

Method according to one of embodiments 1 to 4, the method further comprising pre-sintering the at least two materials before filling the mold, each of the at least two materials being provided as a powder.

Embodiment 6

Method according to one of embodiments 1 to 5, wherein the material volume in the mold is reduced to less than 90% or less than 50% of the material volume, or to at most 10% of the material volume, by exposure to a pressure.

Embodiment 7

Method according to one of embodiments 1 to 6, wherein the exposure to a pressure is accomplished by a CNC-controlled hydraulic press.

Embodiment 8

Method for fabricating a magnetic core, comprising:
providing at least a first material and a second material comprising different magnetic properties, the first material comprising a first ferrite material and the second material comprising a second ferrite material and/or an oxide ceramic material;
forming at least a first material volume portion by pressing at least a portion of the provided first material;
forming at least a second material volume portion by pressing at least a portion of the provided second material;
applying a liquid for forming a liquid film at least on one exposed surface of said first material volume portion and/or said second material volume portion; and
arranging a material volume portion directly on the liquid film of another material volume portion.

Embodiment 9

Method according to embodiment 8, wherein the liquid is an aqueous or alcoholic solution of polyethylene glycol or polyvinyl alcohol or acrylate or a mixture thereof.

Embodiment 10

Method according to embodiment 8 or 9, wherein the arranging of a material volume portion comprises performing a rotation of the material volume portion during the arrangement operation.

Embodiment 11

Method according to one of embodiments 8 to 10, wherein the method further comprises sintering the arranged material volume portions.

Embodiment 12

Magnetic core, comprising:
at least two regions connected to each other and arranged alternately along a longitudinal direction of the magnetic core,
at least a first material and a second material differing from each other and comprising different magnetic permeabilities, wherein each of the regions comprises a material of said at least one first and second materials;
wherein said first material comprises a first ferrite material and said second material comprises a second ferrite material and/or an oxide ceramic material, or the second material comprises a superparamagnetic material.

Embodiment 13

Magnetic core according to embodiment 12, wherein at least one region is embodied as a layer extending over the complete cross-section of the magnetic core.

Embodiment 14

Magnetic core according to embodiment 12 or 13, wherein the second material comprises a relative permeability of lower than 10 and the first material comprises a relative permeability of higher than 10.

Embodiment 15

Magnetic core according to embodiment 14, wherein the second material comprises a relative permeability of lower than 3.

Embodiment 16

Magnetic core according to one of embodiments 12 to 15, wherein the coefficients of linear extension of the at least two materials differ from each other by less than 10% or by less than 5% or by less than 1% or by less than 0.5%.

Embodiment 17

Magnetic core according to one of embodiments 12 to 16, wherein the first ferrite material comprises an additive which comprises at least one of the group consisting of Ti, Al, Cr, Mg, Cu, Ni, Sn, Ge, Sr, K, Nb, Zr, Ca, Si, V, Co, Hf, W, and Bi, an oxide of one of these elements, and/or a carbonate of one of these elements, and/or any compound of these elements.

Embodiment 18

Magnetic core according to one of embodiments 12 to 17, wherein the second material has a superparamagnetic behavior.

Embodiment 19

Magnetic core according to embodiment 18, wherein the second material is a composite material of nanoscale particles having a maximum dimension within a range of 5 nm to 50 nm.

Embodiment 20

Magnetic core according to embodiment 19, wherein the nanoscale particles comprise a ferrite material or a metal material.

Embodiment 21

Magnetic core according to one of embodiments 18 to 20, wherein the second material comprises a relative permeability $\mu_r$ with $1<\mu_r<3$, or $1<\mu_r<2$, or $1<\mu_r<1.6$, or $1<\mu_r<1.3$.

Embodiment 22

Magnetic core according to one of embodiments 12 to 18, wherein said second material comprises said second ferrite material, and said first and second ferrite materials have different Curie temperatures and/or different saturation flux densities.

Embodiment 23

Magnetic core according to embodiment 22, wherein said first ferrite material and said second ferrite material comprise different substance amount fractions of Zn and/or Cu.

Embodiment 24

Magnetic core according to embodiment 22 or 23, wherein the first ferrite material or the second ferrite material comprise a substance amount fraction of ZnO within a range of 0 mol % to 60 mol %, and/or of $Fe_2O_3$ within a range of 20 mol % to 80 mol %, and/or of MnO or NiO within a range of 5 mol % to 60 mol %.

Embodiment 25

Magnetic core according to one of embodiments 22 to 24, wherein the second ferrite material has a Curie temperature within a range of <0° C., or of 0° C. to 100° C., or of 0° C. to 50° C., or of 15° C. to 35° C., and the first ferrite material has a Curie temperature within a range of 100° C. to 700° C., or of 100° C. to 500° C., or of 200° C. to 350° C.

Embodiment 26

Magnetic core according to one of embodiments 12 to 25, wherein at least one region with the second material is at most as large as the smallest one of the directly adjoining regions with the first material.

Embodiment 27

Magnetic core according to one of embodiments 12 or 26, wherein regions with the second material become smaller from a center of the magnetic core in the longitudinal direction of the core towards an edge of the magnetic core.

Embodiment 28

Magnetic core according to one of embodiments 12 to 27, wherein at least one region with the second material is at most as large as the smallest region with the first material.

Embodiment 29

Magnetic core according to one of embodiments 12 to 28, wherein a proportion of a partial volume of a region comprising a ferrite material, in which the percentage by mass of the ferrite material of more than 90 mass percent or more than 95 mass percent decreases to less than 30 mass percent or less than 10 mass percent or less than 5 mass percent or less than 1 mass percent, to a total volume of the region is less than 30% or less than 10% or less than 5% or less than 1%.

Embodiment 30

Multi-portion core arrangement, comprising:
at least one magnetic core according to one of embodiments 12 to 29; and at least one winding provided over the at least one magnetic core.

In summary, magnetic cores and methods for producing the same are provided, wherein the magnetic cores comprise at least two materials with different magnetic properties, wherein the materials are selected from a ferrite material, an oxide ceramic material, and a superparamagnetic material and are alternately formed along the magnetic core in individual regions.

What is claimed is:
1. Method for fabricating a magnetic core, comprising:
providing at least a first magnetic core material and a second magnetic core material comprising different magnetic properties
forming at least a first material volume portion by pressing at least a portion of the provided first magnetic core material;
forming at least a second material volume portion by pressing at least a portion of the provided second magnetic core material;
applying a liquid for forming a liquid film at least on one exposed surface of said first material volume portion, wherein a portion of the first magnetic core material of the at least one exposed surface on which the liquid is applied is dissolved within the liquid; and
arranging the second material volume portion directly on the liquid film on the at least one exposed surface of the first material volume portion, whereby a connection is formed between the first material volume portion and the second material volume portion.

2. A method for fabricating a magnetic core as in claim 1, wherein:
the liquid is selected from the group consisting of a solution of polyethylene glycol, polyvinyl alcohol, and acrylate or a mixture thereof.

3. A method for fabricating a magnetic core as in claim 1, further comprising the step of:
sintering the arranged first and second material volume portions.

4. A method for fabricating a magnetic core as in claim 1, wherein:
at least one of the first and second material volume portions is embodied as a layer extending over a complete cross-section of the magnetic core.

5. A method for fabricating a magnetic core as in claim 1 wherein:
the first magnetic core material and the second magnetic core material are selected from the group consisting of a ferrite material, an oxide ceramic material, and a superparamagnetic material.

6. A method for fabricating a magnetic core, comprising:
providing at least a first material and a second material comprising different magnetic properties, said first material comprising a first ferrite material and said second material comprising a second ferrite material;
forming at least a first material volume portion by pressing at least a portion of the provided first material;
forming at least a second material volume portion by pressing at least a portion of the provided second material;
applying a liquid for forming a liquid film at least on one exposed surface of said first material volume portion or said second material volume portion;
arranging a material volume portion directly on the liquid film of another material volume portion; and
wherein the second material comprises a relative permeability of lower than 10 and the first material comprises a relative permeability of higher than 10.

7. A method for fabricating a magnetic core as in claim 6, wherein:
the second material comprises a relative permeability of lower than 3.

8. A method for fabricating a magnetic core as in claim 6, wherein:
coefficients of linear extension of the first and second material differ from each other by less than 10%.

9. A method for fabricating a magnetic core as in claim 6, wherein:
the first material comprises an additive which comprises an oxide, a carbonate, or a compound selected from the group consisting of Ti, Al, Cr, Mg, Cu, Ni, Sn, Ge, Sr, K, Nb, Zr, Ca, Si, V, Co, Hf, W, and Bi.

10. A method for fabricating a magnetic core as in claim 6, wherein:
the second material has a superparamagnetic behavior.

11. A method for fabricating a magnetic core as in claim 6, wherein:
the second material is a composite material of nanoscale particles having a maximum dimension within a range of 5 nm to 50 nm.

12. A method for fabricating a magnetic core as in claim 11, wherein:
the nanoscale particles comprise a ferrite material or a metal material.

13. A method for fabricating a magnetic core as in claim 6, wherein:
the second material comprises the relative permeability $\mu_r$ with $1<\mu_r<3$.

14. A method for fabricating a magnetic core as in claim 6, wherein:
the first and second materials are ferrite materials and have different Curie temperatures.

15. A method for fabricating a magnetic core as in claim 14, wherein:
the second material has the Curie temperature within a range of less than 0° C. to 100° C., and the first material has the Curie temperature within a range of 100° C. to 700° C.

16. A method for fabricating a magnetic core as in claim 14, wherein:
the first material or the second material comprise a substance amount fraction selected from the group consisting of ZnO within a range of 0 mol % to 60 mol %, $Fe_2O_3$ within a range of 20 mol % to 80 mol %, MnO within a range of 5 mol % to 60 mol %, and NiO within a range of 5 mol % to 60 mol %.

17. A method for fabricating a magnetic core as in claim 14, wherein:
said first material and said second material comprise different substance amount fractions selected from the group consisting of Zn and Cu.

18. A method for fabricating a magnetic core as in claim 6, wherein:
a volume of at least one region with the second material is as large as a volume of a smallest one of a directly adjoining region with the first material.

19. A method for fabricating a magnetic core as in claim 6, wherein:
regions with the second material become smaller from a center of the magnetic core in a longitudinal direction of the magnetic core towards an edge of the magnetic core in the longitudinal direction.

20. A method for fabricating a magnetic core as in claim 6, wherein:
at least one region with the second material is as large as a smallest region with the first material.

21. A method for fabricating a magnetic core as in claim 6, wherein:
a proportion of a partial volume of a region comprising the second ferrite material, in which a percentage by mass of the second ferrite material of more than 90 mass percent decreases to less than 30 mass percent, to a total volume of the region is less than 30%.

22. A method for fabricating a magnetic core as in claim 6, further comprising the step of:
placing a winding over the magnetic core.

* * * * *